United States Patent [19]
Akamatsu et al.

[11] Patent Number: 6,118,309
[45] Date of Patent: Sep. 12, 2000

[54] SEMICONDUCTOR CIRCUIT

[75] Inventors: Hironori Akamatsu, Hirakata; Toru Iwata, Osaka, both of Japan

[73] Assignee: Matsushita Electric Industrial Co., Ltd., Osaka, Japan

[21] Appl. No.: 09/121,191

[22] Filed: Jul. 23, 1998

Related U.S. Application Data

[62] Division of application No. 08/862,017, May 22, 1997, Pat. No. 5,933,050.

[30] Foreign Application Priority Data

May 22, 1996 [JP] Japan ................................ 8-126741

[51] Int. Cl.[7] .............................................. H03K 19/0948
[52] U.S. Cl. ............................ 327/108; 327/111; 326/119
[58] Field of Search ............................. 327/34, 172, 173, 327/174, 175, 176, 108, 111, 112, 538; 326/26, 27, 29, 31, 34, 82, 83, 119, 121, 120, 122

[56] References Cited

U.S. PATENT DOCUMENTS

| | | | |
|---|---|---|---|
| 4,464,581 | 8/1984 | Oritani | 327/172 |
| 4,471,235 | 9/1984 | Sakhuja et al. | 327/34 |
| 5,486,774 | 1/1996 | Douseki et al. | 327/541 |
| 5,614,847 | 3/1997 | Kawahara et al. | 326/98 |
| 5,638,017 | 6/1997 | Kim | 327/176 |
| 5,703,515 | 12/1997 | Toyama et al. | 327/294 |
| 5,751,651 | 5/1998 | Ooishi | 365/226 |
| 5,764,566 | 6/1998 | Akamatsu et al. | 365/156 |

FOREIGN PATENT DOCUMENTS 6-208790  7/1994  Japan.

*Primary Examiner*—Tuan T. Lam
*Attorney, Agent, or Firm*—Ratner & Prestia

[57] ABSTRACT

A semiconductor circuit includes an input, an output, and a first transistor and a second transistor coupled in series to a power source. The first transistor is coupled closer to the power source than the second transistor is, and the first transistor has a higher threshold voltage than a threshold voltage of the second transistor. The semiconductor circuit further includes a capacitor which is coupled between the first transistor and the second transistor.

6 Claims, 8 Drawing Sheets

SEMICONDUCTOR CIRCUIT

This application is a division of U.S. patent application Ser. No. 08/862,017, filed on May 22, 1997, now U.S. Pat. No. 5,933,050.

BACKGROUND OF THE INVENTION

1. Field of the Invention

The present invention relates to a semiconductor IC (integrated circuit), and in particular to a high-speed semiconductor IC which consumes relatively little power, the semiconductor IC being composed essentially of micro devices.

2. Description of the Related Art

The entire disclosure of U.S. patent application Ser. No. 08/862,017 filed May 22, 1997 is expressly incorporated by reference herein.

In the field of DRAMs (dynamic random access memories) and other LSI (large scale integration) circuits, there has recently been an increased demand for decreased power consumption, increased integration density, and facilitation of battery operation. These demands have led to demands for circuits which are capable of operating at a low voltage. Vigorous development activities have been made to achieve such goals.

In order for an LSI to operate at a low voltage, it is important to reduce the threshold voltage of MOS transistors, which are important constituent elements of the LSI. However, the problem of a leak current, which occurs when a transistor is turned off, imposes a practical limit to the extent of reduction in the threshold voltage of a MOS transistor. It is also known that decreasing the supply voltage without decreasing the threshold voltage of the MOS transistor results in a noticeable deterioration of the operation speed. Various inventions have been made to solve this problem, e.g,. a technique proposed in Japanese Laid-Open Patent Publication No.6-208790 (D. TAKASHIMA).

Japanese Laid-Open Patent Publication No.6-208790 describes in its FIG. 4(b) a circuit in which a plurality of NMOS transistors are coupled in series between a NAND circuit and a power source in such a manner that the NMOS transistor located closest to the power source has a threshold voltage higher than those of all the other NMOS transistors. As a result, the NMOS transistor located closest to the power source (having a threshold voltage higher than those of the other NMOS transistors) is cut off during a stand-by state. Thus, the circuit is capable of operating rapidly at a low voltage without increasing the leak current.

However, the circuit described in Japanese Laid-Open Patent Publication No.6-208790 is not capable of operating rapidly at a low voltage when (1) the input to the circuit shifts so as to activate the high-threshold NMOS transistor, or (2) the input to the high-threshold NMOS transistor varies the latest among the inputs to all the NMOS transistors.

SUMMARY OF THE INVENTION

According to one aspect of the invention, a semiconductor circuit includes: an input; an output; a first transistor and a second transistor coupled in series to a power source, wherein the first transistor is coupled closer to the power source than the second transistor is and wherein the first transistor has a higher threshold voltage than a threshold voltage of the second transistor; and a capacitor is coupled between the first transistor and the second transistor.

The first transistor may be cut off during a stand-by state.

During an operation, the first transistor may be controlled so as to be closed earlier than the second transistor is closed, whereby a redistribution of charge occurs between a capacitance coupled to the output and the capacitor. Preferably, the first transistor is controlled so as to be closed earlier than the second transistor is closed by at least a length of time that is required for charging or discharging the capacitor, whereby a redistribution of charge occurs between a capacitance coupled to the output and the capacitor.

In one embodiment of the invention, the output is coupled to a further circuit, and the capacitor has a capacitance value prescribed so that a potential of the output after the redistribution of charge exceeds a voltage level for operating the further circuit.

The first transistor and the second transistor may be MOS transistors of the same conductivity type.

In another embodiment of the invention, a substrate on which the transistors are formed has a potential which is equal to a source potential of at least one of the transistors.

According to another aspect of the invention, a semiconductor circuit includes: a plurality of input terminals including first and second input terminals; and at least one output terminal, a first input signal having a first timing being input to the first input terminal, a second input signal having a second timing being input to the second input terminal, an output signal being output to the output terminal, the output signal taking one of two levels, wherein the timing of transition of the output signal from one of the two levels to the other level is determined in accordance with the first timing, and the timing of transition of the output signal from the other level to the one level is determined in accordance with the second timing.

In one embodiment of the invention, the semiconductor circuit further includes a first driving circuit for generating a signal having a steep falling edge as the first input signal and a second driving circuit for generating a signal having a steep rising edge as the second input signal, wherein the first timing dictates a fall of the first input signal and the second timing dictates a rise of the second input signal.

In another embodiment of the invention, the semiconductor circuit further includes a plurality of transistors coupled in series to a power source and a capacitor provided between one of the plurality of transistors that is located to the power source and the other ones of the plurality of transistors, wherein the one of the plurality of transistors that is located to the power source has a threshold voltage which is higher than threshold voltages of the other ones of the plurality of transistors, and each of the plurality of transistors is coupled to a corresponding one of the plurality of input terminals.

In still another embodiment of the invention, the one of the plurality of transistors that is located to the power source is controlled in accordance with the first input signal having a steep falling edge.

In yet another embodiment of the invention, the first signal has a gentle rising edge and the second signal has a gentle falling edge, and the one of the plurality of transistors that is located to the power source is closed at a rise of the first input signal or a fall of the second input signal, thereby completing the charging or discharging of the capacitor.

In yet another embodiment of the invention, the rise of the first input signal is prescribed to occur earlier than a rise of the second input signal in the case where the one of the plurality of transistors that is located to the power source is closed at the rise of the first input signal; and the fall of the second input signal is prescribed to occur earlier than a fall of the first input signal in the case where the one of the plurality of transistors that is located to the power source is closed at the fall of the second input signal.

In accordance with the above configuration, the semiconductor circuit according to the present invention is capable of operating at a low voltage without any substantial decrease in its operation speed. As a result, there is realized an IC which consumes relatively little power. Moreover, since the semiconductor circuit can operate at a low voltage, the charge/discharge current of the semiconductor circuit is also be reduced, whereby the reliability and noise resistance of signal wiring can also be improved.

Thus, the invention described herein makes possible the advantage of providing a semiconductor circuit which includes a MOS transistor having a low threshold voltage such that the semiconductor circuit is capable of operating rapidly at a low voltage without increasing the leak current when the transistor is turned off.

This and other advantages of the present invention will become apparent to those skilled in the art upon reading and understanding the following detailed description with reference to the accompanying figures.

DESCRIPTION OF THE PREFERRED EMBODIMENTS

Hereinafter, the semiconductor circuit according to the present invention will be described by way of examples, with reference to the accompanying drawings.

EXAMPLE 1

First, the principle of the operation of the semiconductor circuit according to Example 1 of the present invention will be described with reference to FIGS. 1A, 1B, and FIGS. 2A to 2E.

Figure 1A:
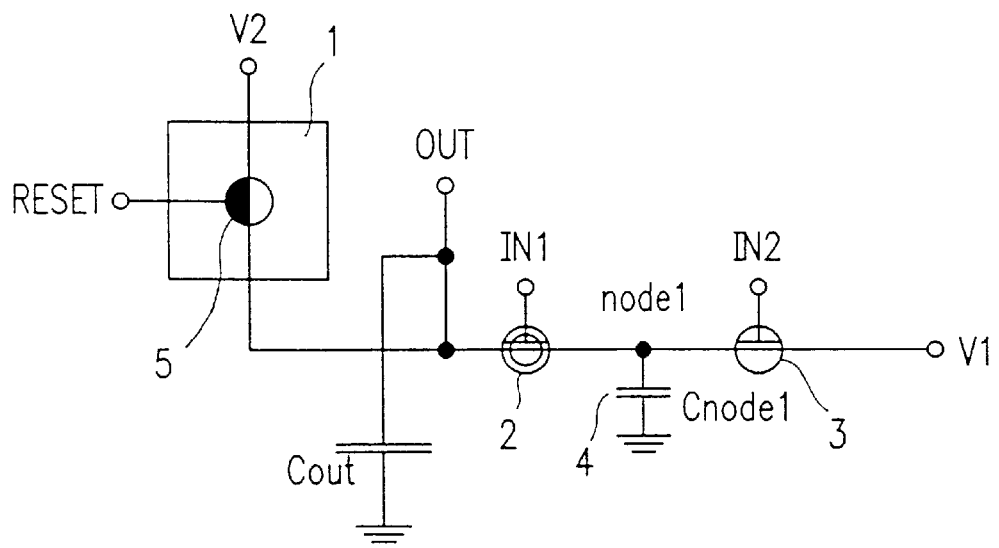
FIG. 1A is a circuit diagram illustrating the fundamental configuration of a semiconductor circuit according to Example 1 of the present invention.

FIG. 1A is a diagram showing the fundamental configuration of the semiconductor circuit according to the present invention. As shown in FIG. 1A, the semiconductor circuit includes a reset circuit 1 coupled to a power source V1, and a switching section coupled between the power source V1 and the reset circuit 1. In order to allow the potential of a terminal OUT to quickly approach the potential of the power source V1, the threshold voltage of the transistor(s) employed in the switching section needs to be lowered. However, lowering the threshold voltage may result in an increase in the leak current, that is, an unwanted current may flow when the switching section is supposed to be open (i.e., non-conducting). Therefore, the switching section in the circuit shown in FIG. 1A includes an NMOS transistor 2 having a low threshold voltage and an NMOS transistor 3 having a high threshold voltage, the NMOS transistors 2 and 3 being coupled in series in such a manner that the NMOS transistors 3 (having a high threshold voltage) is located closer to the power source V1. In accordance with this configuration, the NMOS transistor 3 (having a high threshold voltage) is cut off in a stand-by state, thereby reducing the influence of the leak current from the NMOS transistor 2 (having a low threshold voltage).

In the present specification, "a reset circuit" generally refers to a circuit which makes the potential of the terminal OUT to be the potential of the power source V1 or the power source V2 in accordance with a signal supplied to the terminal RESET. Please note that the power source V1 or V2 may provide any level of the potential. For example, a power source providing the ground level potential may be used as either one of the power sources V1 and V2. In addition, in the present specification, a transistor having "a high threshold voltage" merely implies a transistor whose threshold voltage is higher than the threshold voltages of other transistors in the circuitry. Therefore, the threshold voltage of the NMOS transistor 3 located closer to the power source V1 does not need to be higher than what is considered as an ordinary threshold voltage in the field of art.

Typically, the threshold voltage of the transistor is set to be in a range of about 0.5 V to about 0.7 V. In the semiconductor circuit of the present example, the threshold voltage of the low-threshold transistor 2 can be set to be any voltage as long as it is lower than the above range of the threshold voltage. On the other hand, the threshold voltage of the high-threshold transistor 3 may fall within the above range or may be set to be higher than the above range.

However, merely adopting the configuration including serially-coupled the MOS transistor 2 having a low threshold voltage and the MOS transistor 3 having a high threshold voltage inevitably results in a decrease in the operation speed. In order to prevent such a decrease in the operation speed, the semiconductor circuit of the present invention additionally includes a capacitor 4 between the serially-coupled MOS transistors 2 and 3.

Figure 1B:
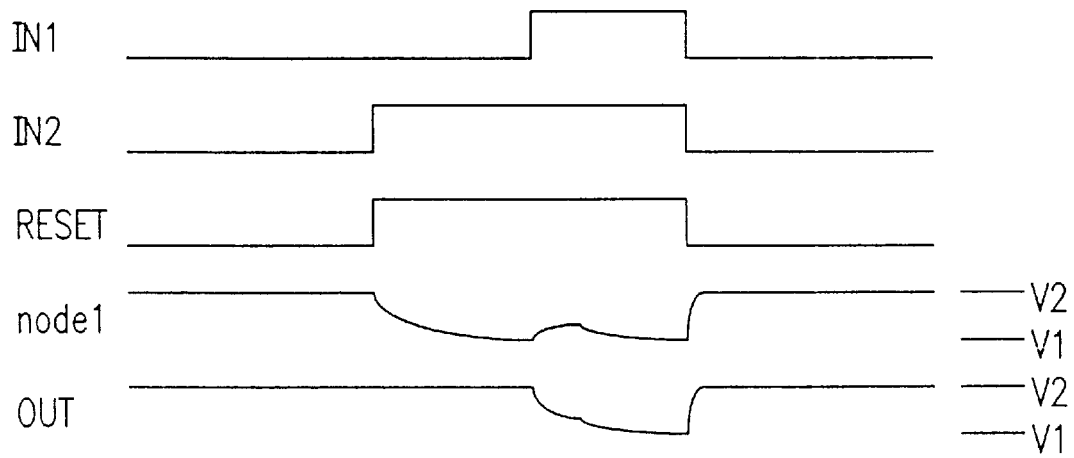
FIG. 1B is a diagram showing the operational timing of the semiconductor circuit shown in FIG. 1A.

In the semiconductor circuit having the above-described configuration according to the present invention, the potential of the power source V1 is applied to the terminal OUT as follows:

First, as shown in FIG. 1B, an input signal IN2 supplied to the gate of the high-threshold NMOS transistor 3 goes High so as to close the NMOS transistor 3 (i.e., so that the transistor conducts). As a result, a charge corresponding to the potential of the power source V1 is stored in the capacitor 4, with the potential of a node node1 undergoing a change as described in FIG. 1B. Thereafter, an input signal IN1 supplied to the gate of the low-threshold NMOS transistor 2 goes High so as to close the NMOS transistor 2 (i.e., so that the transistor conducts). As a result, redistribution of charge occurs to cause the potential of the terminal OUT to shift to a potential which is determined in accordance with a capacitance connected to the terminal OUT (a parasitic capacitance Cout at the terminal OUT in FIG. 1A) and a capacitance Cnode1 of the capacitor 4 of the switch section. The charge corresponding to this potential of the terminal OUT is drained via the high-threshold transistor 3.

The difference between the time at which the high-threshold transistor 3 is closed (turns on) and the time at which the low-threshold transistor 2 is closed (turns on) is determined so that the charge corresponding to the potential of the power source V1 can be stored in the capacitor 4 completely. The charge storing operation of the capacitor 4 refers to charging operation or discharging operation depending on the relationship of potential between the power sources V1 and V2. Thus, the high-threshold transistor 3 is closed earlier than the low-threshold transistor 2 is closed by at least a length of time which is required for charging or discharging the capacitor 4 so as to store the charge corresponding to the potential of the power source V1.

Figure 2A:
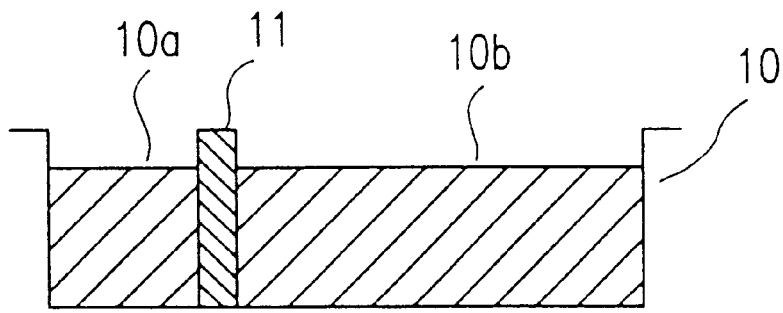
FIGS. 2A to 2E are diagrams describing the operation principle of the semiconductor circuit shown in FIG. 1A.

The above operation is further described by referring to the schematic diagrams of FIGS. 2A to 2E. For conciseness, FIG. 2A illustrates the circuit of FIG. 1A when the transistors 2 and 3 are both in an open state (i.e., non-conducting state) on the analogy of a vessel 10 with a partitioning plate 11 that is filled with water (i.e., charge).

Figure 2B:
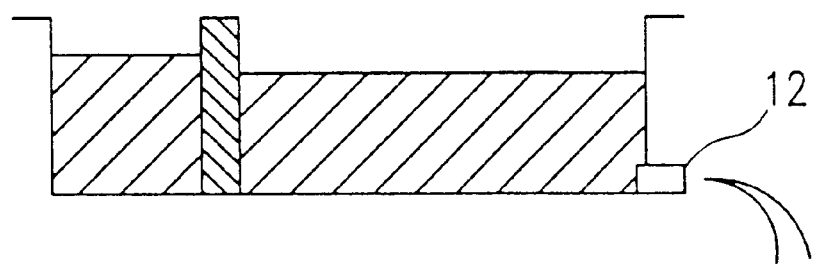
Figure 2C:
Figure 2D:
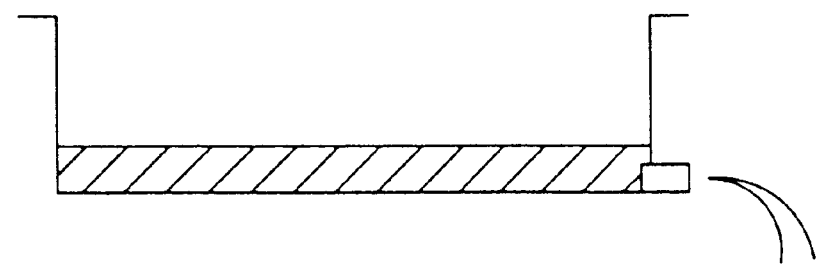
Figure 2E:

First, as shown in FIGS. 2B and 2C, a hole 12 is made in a portion of the vessel 10 so that a portion 10b as partitioned by the plate 11 is gradually emptied. This transition in state corresponds to the operation where the high-threshold MOS transistor 3 is closed so as to store a charge corresponding to the potential of the power source V1 in the capacitor 4. Thereafter, the partitioning plate 11 is removed so that, as shown in FIG. 2D, the level of the remaining water in the other portion 10a (as partitioned by the plate 11) is averaged over the entire area of the bottom face of the vessel 10, to a height lower than the original level of the water. This transition corresponds to the redistribution of charge that occurs as the low-threshold MOS transistor 2 is closed; the final height of the water corresponds to the potential of the terminal OUT. The water whose level has been averaged over the entire area of the bottom face of the vessel 10 is drained through the hole 12; that is, the potential of the terminal OUT becomes closer to that of the power source V1.

Thus, in order to cause the potential of the terminal OUT to shift to that of the power source V1, the semiconductor circuit of the present invention not only utilizes a phenomenon where a switch section is closed to cause a current to flow therethrough, but also additionally incorporates the capacitance 4 between the low-threshold MOS transistor 2 and the high-threshold MOS transistor 3, which are coupled in series between the reset circuit 1 and the power source V1 such that the high-threshold MOS transistor 3 (located closer to the power source V1) is closed earlier than the other MOS transistor 2 to ensure that a redistribution of charge occurs later as the low-threshold MOS transistor 2 is closed. As a result, the semiconductor circuit can rapidly operate at a low voltage while maintaining the leak current at a low level.

Figure 3:
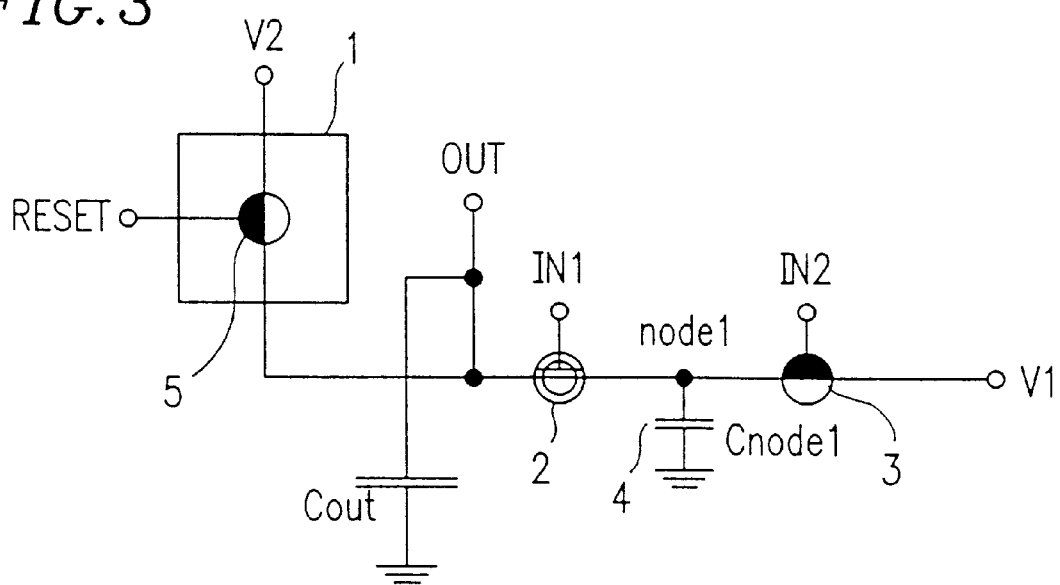
FIG. 3 is a circuit diagram illustrating a variant of the semiconductor circuit shown in FIG. 1A.

The MOS transistors of the switching section can take any one of various configurations as long as the MOS transistor that is closer to the power source V1 has a higher threshold voltage than that of the other transistor. For example, the MOS transistors may be of the same conductivity type as shown in FIG. 1A, or of opposite conductivity types as shown in FIG. 3. In the circuit shown in FIG. 3, a PMOS transistor is used as a transistor which is closer to the power source V1 and has a higher threshold voltage. The switching section can be composed essentially of elements other than MOS transistors which function as switches.

Figure 4:
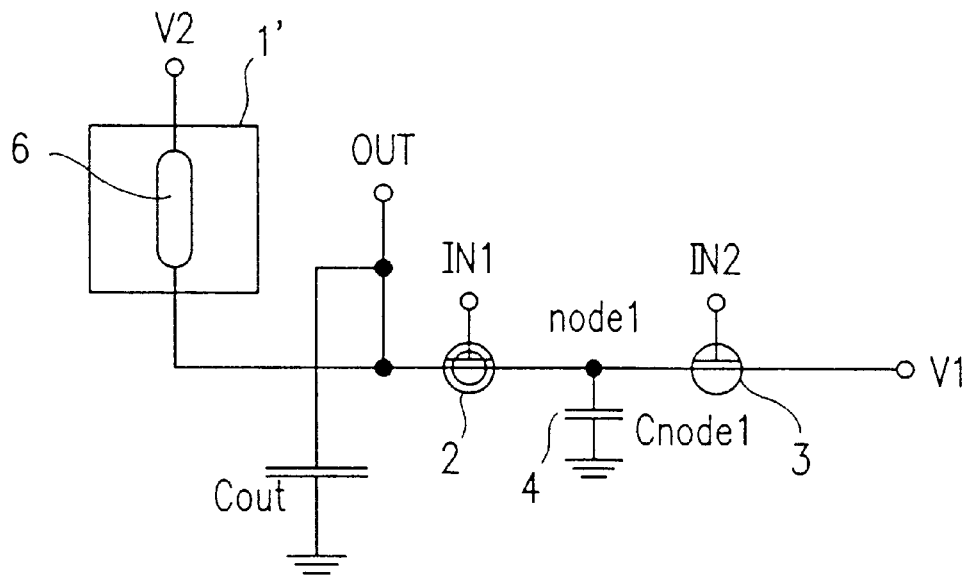
FIG. 4 is a circuit diagram illustrating a variant of the semiconductor circuit shown in FIG. 1A.

FIG. 4 illustrates an exemplary configuration of the semiconductor circuit according to the present invention where a PMOS transistor 5 in the reset circuit 1 in FIG. 1A is replaced by a resistor 6. The reset circuit 1 or 1' (as shown in FIGS. 1A, 3 and 4) may take any configuration that enables the terminal OUT to reach a level equal to the potential of the power source V1 or the power source of V2, for example, in accordance with the signal supplied to the terminal RESET (as shown in FIGS. 1A and 3).

Figure 5:
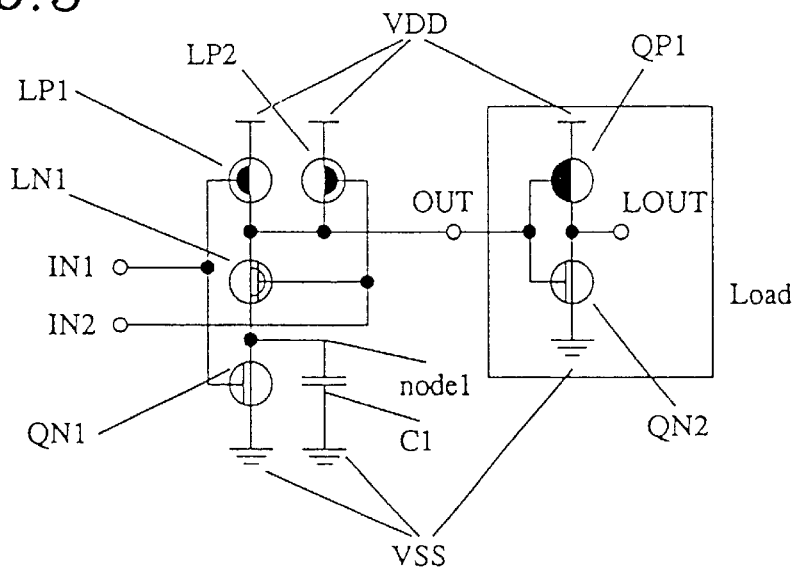
FIG. 5 is a circuit diagram illustrating the application of the semiconductor circuit according to Example 1 to a NAND circuit.

FIG. 5 is a circuit diagram illustrating the application of the semiconductor circuit according to Example 1 to a NAND circuit.

The semiconductor circuit of FIG. 5 includes a NAND circuit coupled to a first power source VDD and a second power source VSS. The NAND circuit includes PMOS transistors LP1 and LP2 (both having a low threshold voltage) coupled to the first power source VDD, and NMOS transistors LN1 and QN1 coupled between the PMOS transistors LP1 and LP2 and the second power source VSS. The terminals of the low-threshold PMOS transistors LP1 and LP2 which are not coupled to the first power source VDD are coupled to an output terminal OUT. In this circuit structure, the second power source VSS corresponds to the power source V1 in the circuit shown in FIG. 1A, whereas the NMOS transistors LN1 and QN1 correspond to the low-threshold transistor 2 and the high-threshold transistor 3, respectively, in the circuit shown in FIG. 1A. A capacitor C1 is provided between the transistors LN1 and QN1. A load circuit Load is coupled to the output terminal OUT.

Now, the operation of the semiconductor circuit having the above configuration will be described.

As mentioned earlier with reference to FIG. 1A, the high-threshold NMOS transistor QN1 is provided in order to reduce the leak current of the circuit in a stand-by state, and therefore is cut off during a standby state.

During operation, in order to enable the NAND circuit to rapidly operate at a low power voltage, the low-threshold transistors LP1, LP2, and LN1 are used to quickly charge the output terminal OUT. The discharge via the output terminal OUT is attained by ensuring that the high-threshold NMOS transistor QN1 is closed earlier than the low-threshold NMOS transistor LN1, whereby redistribution of charge occurs between the capacitor C1 and a capacitance coupled to the terminal OUT (which corresponds to a total of the parasitic capacitance and the input capacitance of the load circuit Load in FIG. 5).

Figure 6A:
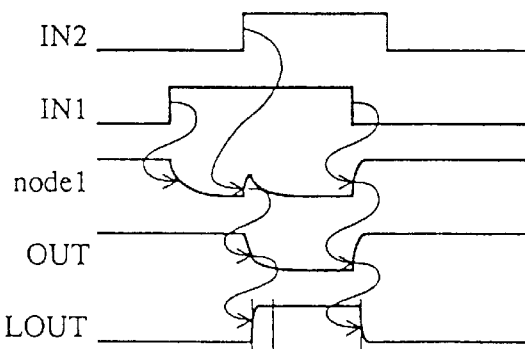
FIG. 6A is a diagram showing the operational timing of the semiconductor circuit shown in FIG. 5.

The discharging via the output terminal OUT will be described more specifically: First, the signal supplied to the input terminal IN1 of the high-threshold NMOS transistor QN1 is raised to the High level. As a result, as shown in FIG. 6A, the charge is drained via an internal node node1 to which the capacitor C1 is coupled so that the potential of the internal node node1 decreases. Thereafter, the signal supplied to the input terminal IN2 of the low-threshold NMOS transistor LN1 is raised to the High level so that a redistribution of charge occurs between the input capacitance of the load circuit Load and the parasitic capacitance which are both coupled to the output terminal OUT and the capacitance of the capacitor C1. As a result, the charge is rapidly drained so that the potential of the output terminal OUT decreases to a potential which is determined in accordance with the capacitance of the capacitor C1. Thereafter, the charge is drained via the output terminal OUT via the high-threshold NMOS transistor QN1 to the Low level. Thus, the potential of the output terminal OUT rapidly transits to the Low level.

Preferably, the capacitance of the capacitor C1 is prescribed at a value such that the potential of the output terminal OUT after redistribution of charge occurs exceeds a voltage level which causes the load circuit Load (composed essentially of transistors QP1 and QN2) to operate. In this case, the charge at the output terminal OUT is rapidly drained without being influenced by the amount of the current which flows through the high-threshold NMOS transistor QN1 when the transistor QN1 turns on. Therefore, a rapid operation can be realized at a low power voltage.

Although not illustrated in FIG. 5, the substrate having the low-threshold NMOS transistor LN1 formed thereon may be coupled to a desired power line. However, it is desirable to equalize the substrate potential to the source potential of at least one transistor (that is, it is desirable to couple the substrate potential to the source of at least one transistor) in order to eliminate the influence of substrate bias effects.

In order to ensure that the charge is completely drained via the inner node node1, the high-threshold NMOS transistor QN1 is closed earlier enough than the low-threshold NMOS transistor LN1 is closed, i.e., at least earlier by a length of time that is required for completely discharging the capacitor C1.

Figure 6B:
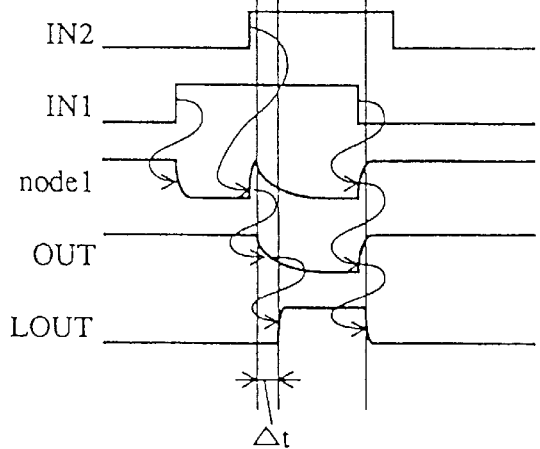
FIG. 6B is a diagram showing the operational timing of a conventional circuit.

Next, for comparison with the operation of the semiconductor circuit in FIG. 5, the operation of a conventional NAND circuit, which includes the high-threshold NMOS transistor and the low-threshold NMOS transistor coupled in series but lacks the capacitor C1, is discussed. FIG. 6B illustrates the operational timing of such a conventional NAND circuit controlled so that the high-threshold NMOS transistor QN1 closed earlier than the low-threshold NMOS transistor LN1. In this case, substantially no capacitance is coupled to the inner node node1. Therefore, the parasitic capacitance, which has a very small value, is virtually the only capacitance that is coupled to the inner node node1. Therefore, even if the conventional semiconductor circuit is controlled so that the level of the input terminal of the high-threshold NMOS transistor QN1 transits to the High level earlier than the low-threshold NMOS transistor LN1, the potential of the output terminal OUT of the NAND circuit experiences substantially no change, as shown in FIG. 6B. Therefore, the redistribution of charge that occurs in the semiconductor circuit of the present invention as shown in FIG. 5 cannot occur in such a conventional semiconductor circuit. As a result, the charge of the output node OUT is drained only by means of the high-threshold NMOS transistor QN1, thereby slowing down the operation speed of the conventional circuit.

In contrast, the operational timing of the semiconductor circuit of the present invention as shown in FIG. 5 is illustrated in FIG. 6A. As seen from FIG. 6A, the charge at the inner node node1 is drained as the input terminal IN1 of the high-threshold NMOS transistor QN1 transits to the High level; followed by a redistribution of charge occurring when the input terminal IN2 of the low-threshold NMOS transistor LN1 transits to the High level. The operation of the semiconductor circuit of FIG. 5 is faster due to the redistribution of charge than that of a conventional circuit, as indicated by the time difference Δt in the change of the output OUT of the load circuit Load shown in FIGS. 6A and 6B.

In the present example, the low-threshold transistor and the high-threshold transistor, which are coupled in series to constitute a switching section, are both NMOS transistors. However, the same effect can also be attained by employing a PMOS transistor for one of the low-threshold transistor and the high-threshold transistor. It will be appreciated that such a configuration will require appropriate changes in the designing of the signals applied to the respective input terminals of the NMOS transistor and the PMOS transistor.

Although a double-input NAND circuit was described in the present example, the present invention is not limited to such circuits. The present invention is applicable to any semiconductor circuit that includes a reset circuit (of any type) for resetting the potential of the output terminal OUT to a certain potential as well as a switching section which is provided between the reset circuit and a power source for closing or opening electrical communication, as in the structure shown in FIG. 1A. According to the present invention, the switching section of such a semiconductor circuit includes a plurality of transistors coupled in series to one another in such a manner that the transistor that is located closest to the power source has a threshold which is higher than those of the other transistors, and additionally a capacitor is incorporated between the transistor closest to the power source and the other transistors. The timing of closing the transistors is controlled as described above so that the semiconductor circuit can rapidly operate at a low voltage while reducing the leak current during a stand-by state.

EXAMPLE 2

Next, another semiconductor circuit according to the present invention will be described with reference to FIGS. 7 and 8. Although lacking the additional capacitors described in the semiconductor circuit shown in FIGS. 1A, 3, 4 and 5, this semiconductor circuit is also capable of rapid operation at a low voltage without increasing the leak current. In the case where the present example is applied to a double-input NAND circuit, for example, different types of driving circuits are inserted before the NAND circuit, so that signals generated by the driving circuits are supplied to the respective transistors included in the NAND circuit.

Figure 7:
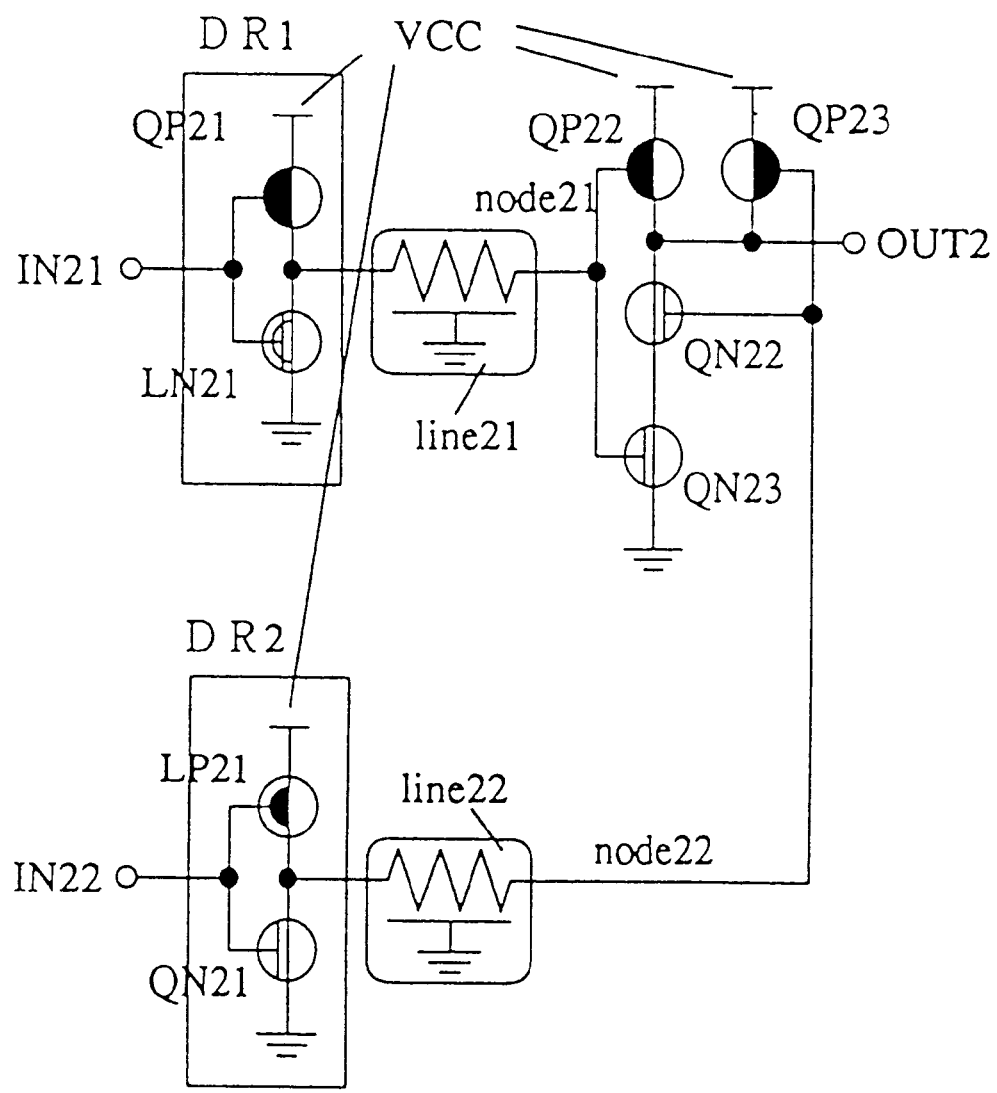
FIG. 7 is a circuit diagram illustrating the application of the semiconductor circuit according to Example 2 to a NAND circuit.
Figure 8:
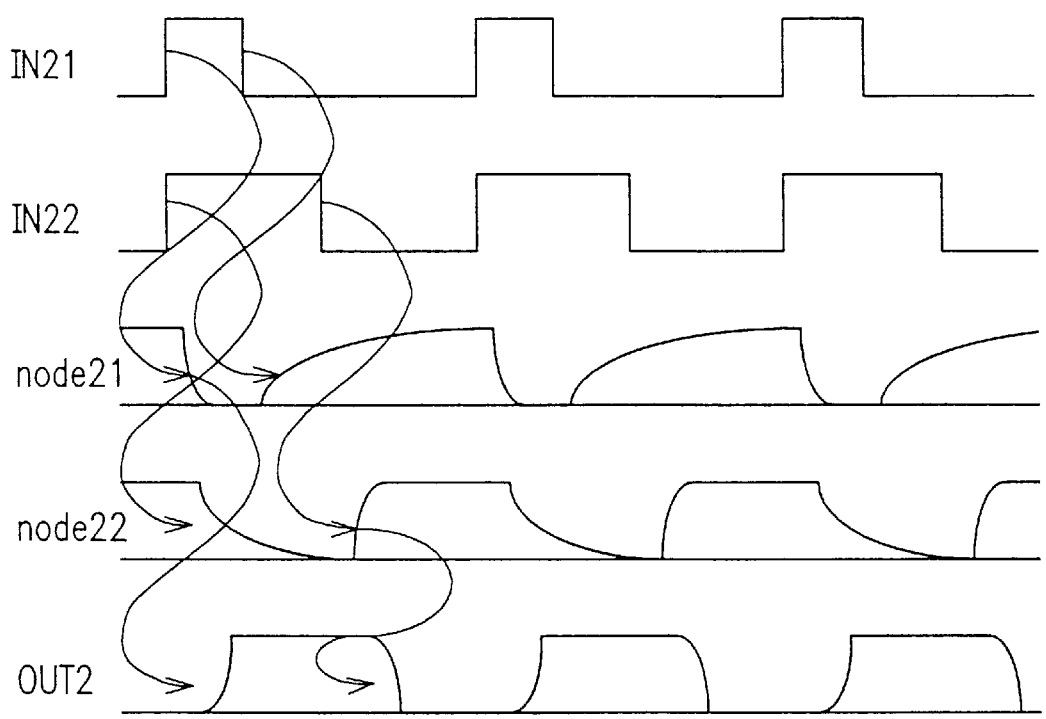
FIG. 8 is a diagram showing the operational timing of the semiconductor circuit shown in FIG. 7.

In FIG. 7, the NAND circuit includes PMOS transistors QP22 and QP23 having an ordinary threshold voltage and coupled to a power source VCC, and NMOS transistors QN22 and QN23 having an ordinary threshold voltage and coupled between a power source (GND) and the transistor QP22 and QP23. A signal from a driving circuit DR1 which is coupled to an input terminal IN21 is supplied to the inputs of the PMOS transistor QP22 and the NMOS transistor QN23 via a wire line21 and an intermediate node node21. A signal from a driving circuit DR2 which is coupled to an input terminal IN22 is supplied to the inputs of the PMOS transistor QP23 and the NMOS transistor QN22 via a wire line22 and an intermediate node node22.

As will be appreciated, the threshold voltages of all the transistors of the NAND circuit according to the present example are prescribed at ordinary threshold voltages in the semiconductor circuit of the present example, in contrast to the conventional structure described in Japanese Laid-Open Patent Publication No.6-208790 or the structure according to Example 1 of the present invention. Instead, a transistor having a threshold voltage lower than the ordinary threshold voltage is incorporated in each of the driving circuits DR1 and DR2.

During operation, the driving circuit DR1 rapidly discharges, via a low-threshold NMOS transistor LN21, at the intermediate node node21 which defines the output of the driving circuit DR1. However, the charging of the intermediate node node21 cannot be made faster than the rate of ordinary charging because it is performed via an ordinary-threshold PMOS transistor QP21. During a standby state, the ordinary-threshold PMOS transistor QP21 is cut off so as to reduce the leak current. On the other hand, the driving circuit DR2 rapidly charges the intermediate node node22 via a low-threshold PMOS transistor LP21. However, the discharging of the intermediate node node22 cannot be made faster than the rate of ordinary discharging because it is performed via an ordinary-threshold NMOS transistor QN21. During a stand-by state, the ordinary-threshold NMOS transistor QN21 is cut off so as to reduce the leak current. As a result, as shown in FIG. 8, the driving circuit DR1 outputs a signal which falls rapidly (i.e., a signal having a steep falling edge) to the intermediate node node21. The driving circuit DR2 outputs a signal which rises rapidly (i.e., a signal having a steep rising edge) to the intermediate node node22.

The signals which are output from the driving circuits DR1 and DR2 to the respective intermediate nodes node21 and node22 are input to the NAND circuit, so that the rapidly falling signal is supplied to the PMOS transistor QP22 and the NMOS transistor QN23, whereas the rapidly rising signal is supplied to the PMOS transistor QP23 and the NMOS transistor QN22. Based on the steep edges of the respective signals, the NAND circuit is able to output to the output terminal OUT2 a signal whose level shifts with the desired timing, as shown in FIG. 8. Thus, the semiconductor circuit can rapidly operate at a low voltage without increasing the leak current.

Moreover, according to the present example, no additional elements are incorporated in the NAND circuit other than those which are indispensable to the circuit. Therefore, the number of elements constituting the NAND circuit is kept from increasing, thereby avoiding an increase in the chip area.

Although the present example described a double-input NAND circuit, the present invention is similarly applicable to any circuit which generates one or more output signals from two or more input signals. As described above, the semiconductor circuit according to the present example includes a driving circuit dedicated to each of two or more input signals, the driving circuit generating a signal at least one of whose edges (i.e., rising and/or falling edge) is relatively steep, based on an input signal. Thus, the signals having respective steep edges are conveniently utilized to generate a signal for final output, thereby realizing a rapid operation at a low power source voltage.

EXAMPLE 3

In the semiconductor circuits described in Examples 1 and 2 of the present invention, it is more preferable to input signals to the respective input terminals in a fixed order. Thus, the present invention is easily applicable especially to a device having a fixed operation order, e.g., a memory device. Example 3 of the present invention illustrates a decoder circuit of a memory device in which the semiconductor circuits of Examples 1 and 2 are combined.

Figure 9:
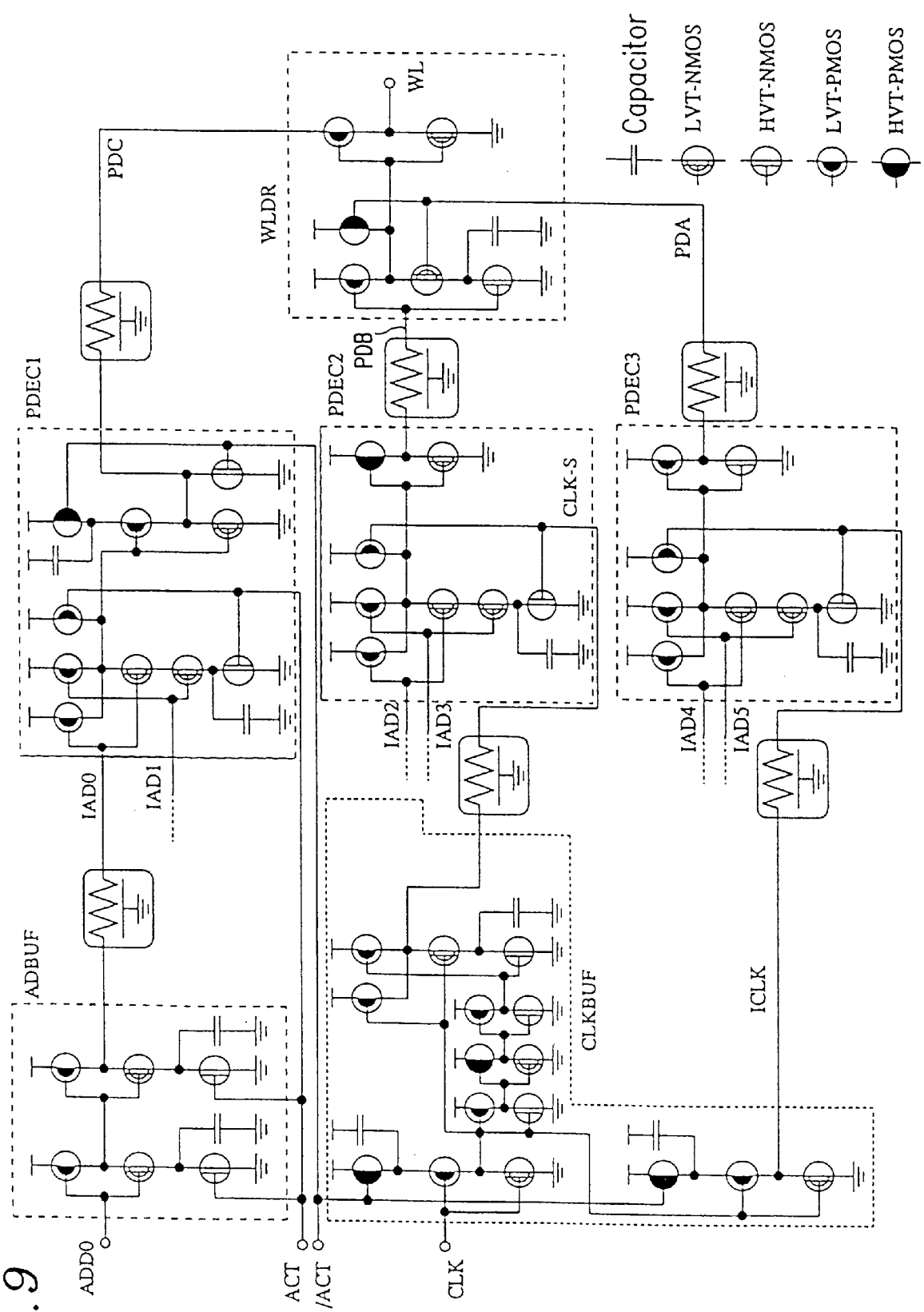
FIG. 9 is a circuit diagram illustrating the application of the semiconductor circuit according to Example 3 to a decoder circuit.

FIG. 9 shows a circuit diagram of a decoder circuit of a memory device according to the present example. As shown in FIG. 9, the decoder circuit includes an address input buffer circuit ADBUF, a clock input buffer circuit CLKBUF, address predecoder circuits PDEC1, PDEC2, and PDEC3, and a word line driving circuit WLDR.

The address input buffer circuit ADBUF receives address information input at an address input terminal ADD0 and transfers the information to an internal address signal line IAD0 within the chip (i.e., within the memory). Although the decoder circuit can include not only one but a plurality of internal address signals, the present example describes a case where six internal address signal lines IAD0 to IAD5 are provided. Although not shown in FIG. 9, an address input buffer circuit and an address input terminal are provided for each of the internal address signal lines IAD1 to IAD5 (as well as for the internal address signal line IAD0) for transferring address information.

The address input buffer circuit ADBUF includes combinations of a low-threshold MOS transistor and a high-threshold transistor that are coupled in series to each other and a capacitor interposed therebetween, as in the structure described referring to FIG. 1A. The address input buffer circuit ADBUF is switched between an operation state and a stand-by state in accordance with a signal input via an activation signal input terminal ACT. During a stand-by state, the high-threshold transistor closer to the ground is cut off so as to reduce the leak current. On the other hand, during an operation, control is made so that the signal input via the input terminal ACT shifts to the High level earlier than the signals input to the address input terminals ADD0 so that the high-threshold NMOS transistor is closed earlier. Thereafter, i.e., after a sufficient time has passed to allow the capacitor to be discharged, the low-threshold NMOS transistor is closed to cause a redistribution of charge, thereby achieving a rapid operation.

The clock input buffer circuit CLKBUF also includes a number of combinations of a low-threshold MOS transistor and a high-threshold transistor that are coupled in series to each other and a capacitor interposed therebetween, as in the structure described referring to FIG. 1A. The clock input buffer circuit CLKBUF is switched between an operation state and a stand-by state in accordance with a signal input via an activation signal input terminal /ACT. The clock input buffer circuit CLKBUF receives a clock input at a clock input terminal CLK and transfers the clock within the chip (i.e., within the memory), and further generates reference clocks CLK-S and ICLK to be used by the predecoder circuits. The generated signal CLK-S has a shorter duration of the Low level than that of the input signal CLK.

The address predecoder circuits PDEC1, PDEC2 and PDEC3, which predecode addresses that are input via the internal address signal lines, similarly include combinations of a low-threshold MOS transistor and a high-threshold transistor that are coupled in series to each other and a capacitor interposed therebetween, as in the structure described referring to FIG. 1A. The address predecoder circuit PDEC1 outputs to an address predecode line PDC a signal generated based on a combination of addresses which are input via the internal address signal lines IAD0 and IAD1. The address predecoder circuit PDEC2 outputs to an address predecode line PDB a signal generated based on a combination of addresses which are input via the internal address signal lines IAD0 and IAD1 and the reference clock CLK-S. The address predecoder circuit PDEC3 outputs to an address predecode line PDA a signal generated based on a combination of addresses which are input via the internal address signal lines IAD4 and IAD5 and the reference clock ICLK.

The word line driving circuit WLDR is a circuit for activating a word line WL based on a combination of address predecode signals which are input via the address predecode lines PDA, PDB, and PDC. This circuit also embodies the fundamental structure of the semiconductor circuit according to Example 1 described referring to FIG. 1A. In actual memory devices, there exists a plurality each of the address predecode lines PDA, PDB, PDC and the word line WL. For conciseness, however, FIG. 9 illustrates only one line for each of such wiring lines.

In the circuit shown in FIG. 9, the combination of the address predecoder circuits PDEC2 and PDEC3 and the word line driving circuit WLDR corresponds to the technique illustrated in Example 2. The address predecoder circuits PDEC2 generates an address predecode signal having a steep falling edge, whereas the address predecoder circuits PDEC3 generates an address predecode signal having a steep rising edge. The word line driving circuit WLDR, receiving these address predecode signals, conveniently utilizes the steep edge of each signal to determine the timing with which the voltage level of the word line WL so that the voltage level of the word line WL shifts from the High level to the Low level as the signal from the address predecode line PDB falls and that the voltage level of the word line WL shifts from the Low level to the High level as the signal from the address predecode line PDA rises.

Figure 10:
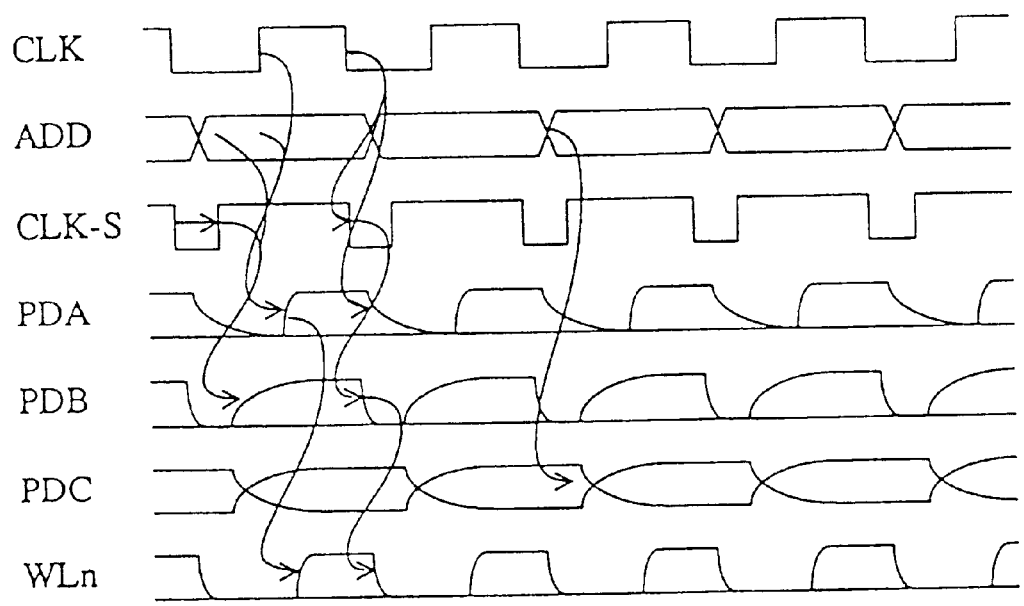
FIG. 10 is a diagram showing the operational timing of the semiconductor circuit shown in FIG. 9.

FIG. 10 is a timing diagram illustrating the operation of the decoder circuit of FIG. 9. As seen from FIG. 9, in the word line driving circuit WLDR, the high-threshold NMOS transistor which is coupled in series between the low-threshold transistor and the ground is coupled to the address predecode line PDB, so that the capacitor is charged ready for the subsequent redistribution of charge as the signal from the address predecode line PDB goes High, i.e., at the gentle or gradual rise of the potential level of the address predecode line PDB. Therefore, in the present example, it is ensured that the signal from the address predecode line PDB stays at the Low level only for a short time based on the reference clock CLK-S, thereby allowing the signal from the address predecode line PDB to rise earlier than the signal from the address predecode line PDA.

Although the present example described a structure in which six addresses are used to decode the word line of a memory, the present invention provides no limitation as to the address structure. The present invention is also applicable to decoding of a column system (data system). Moreover, the present invention is applicable not only to a memory device but to any circuit for which the invention is beneficial.

As described above, the semiconductor circuit according to the present invention is capable of operating at a low voltage without decreasing the operation speed or increasing the leak current. As a result, the semiconductor circuit can have a smaller power consumption than that of conventional semiconductor circuits. Moreover, the present invention requires substantially no increase in size of the circuit, so that an LSI can be provided which does not require increasing the integration density, which would result in a larger power consumption.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor circuit comprising:

a plurality of input terminals including first and second input terminals; and at least one output terminal, a first input signal having a first timing being input to the first input terminal, a second input signal having a second timing being input to the second input terminal, an output signal being output to the output terminal, the output signal taking one of two logical levels, wherein the timing of transition of the output signal from one of the two logical levels to the other logical level is determined in accordance with the first timing, and the timing of transition of the output signal from the other logical level to the one logical level is determined in accordance with the second timing;

a first driving circuit for generating a signal having a steep falling edge as the first input signal; and a second driving circuit for generating a signal having a steep rising edge as the second input signal, wherein the first timing corresponds to a fall of the first input signal and the second timing corresponds to a rise of the second input signal; and a plurality of transistors coupled in series to a power source, and a capacitor provided between one of the plurality of transistors that is located most closely to the power source and the other ones of the plurality of transistors, wherein the one of the plurality of transistors that is located most closely to the power source has a threshold voltage which is higher than threshold voltages of the other ones of the plurality of transistors, and each of the plurality of transistors is coupled to a corresponding one of the plurality of input terminals.

2. A semiconductor circuit according to claim 1, wherein the one of the plurality of transistors that is located most closely to the power source is controlled in accordance with the first input signal having a steep falling edge.

3. A semiconductor circuit according to claim 1, wherein the first input signal has a gradual rising edge and the second input signal has a gradual falling edge, and the one of the plurality of transistors that is located most closely to the power source is closed at a rise of the first input signal, thereby completing the charging or discharging of the capacitor.

4. A semiconductor circuit according to claim 3, wherein the rise of the first input signal is prescribed to occur earlier than a rise of the second input signal.

5. A semiconductor circuit according to claim 1, wherein the first input signal has a gradual rising edge and the second input signal has a gradual falling edge, and the one of the plurality of transistors that is located most closely to the power source is closed at a fall of the second input signal, thereby completing the charging or discharging of the capacitor.

6. A semiconductor circuit according to claim 5, wherein the fall of the second input signal is prescribed to occur earlier than a fall of the first input signal.

* * * * *